US012666892B2

(12) United States Patent
Pranda et al.

(10) Patent No.: US 12,666,892 B2
(45) Date of Patent: Jun. 23, 2026

(54) METHOD FOR ION-ASSISTED SELF-LIMITED CONFORMAL ETCH

(71) Applicant: Tokyo Electron Limited, Tokyo (JP)

(72) Inventors: Adam Pranda, Albany, NY (US);
Christopher Catano, Albany, NY (US);
Yusuke Lent-Yoshida, Albany, NY (US); Aelan Mosden, Albany, NY (US); Yun Han, Albany, NY (US); Ken Kobayashi, Taiwa-cho (JP)

(73) Assignee: Tokyo Electron Limited, Tokyo (JP)

( * ) Notice: Subject to any disclaimer, the term of this patent is extended or adjusted under 35 U.S.C. 154(b) by 170 days.

(21) Appl. No.: 18/619,628

(22) Filed: Mar. 28, 2024

(65) Prior Publication Data

US 2024/0379372 A1 Nov. 14, 2024

Related U.S. Application Data

(60) Provisional application No. 63/465,436, filed on May 10, 2023.

(51) Int. Cl.
H10P 50/24 (2026.01)
H10D 62/10 (2025.01)
(Continued)

(52) U.S. Cl.
CPC ......... H10P 50/242 (2026.01); H10D 62/121 (2025.01); H10D 64/015 (2025.01);
(Continued)

(58) Field of Classification Search
None
See application file for complete search history.

(56) References Cited

U.S. PATENT DOCUMENTS

2007/0026677 A1 2/2007 Ji
2014/0363979 A1 12/2014 Or
(Continued)

OTHER PUBLICATIONS

Cho, Yegeun et al., "Atomic layer etching of SiO2 for surface cleaning using ammonium fluorosilicate with CF4/NH3 plasma," Journal of Vacuum Science and Technology A, J. Vac. Sci. Technol. A 38, 022604 (2020); doi: 10.1116/1.5132986, Jan. 16, 2020, 7 pages.

(Continued)

*Primary Examiner* — Shamim Ahmed
(74) *Attorney, Agent, or Firm* — Slater Matsil, LLP

(57) ABSTRACT

A method for forming a semiconductor device can include providing a substrate having a patterned structure comprising semiconductor materials, where the patterned structure has a side profile including indentations, such as a patterned film stack, and where a spacer layer is conformally deposited over the patterned structure and within the indentations, reacting a surface of the spacer layer with a plasma-excited first etch gas to form a reacted layer on the spacer layer, wherein the plasma-excited first etch gas includes fluorine, hydrogen, and nitrogen, and removing at least part of the reacted layer by ion bombardment from exposure to a plasma-excited second etch gas. The spacer layer can be SiOCN. The reacted layer can be ammonium fluorosilicate. The first etch gas can contain $SF_6$, $H_2$, and $N_2$, or $NF_3$, $H_2$, and $N_2$. The reacting and removing can be done at room temperature in a same chamber.

19 Claims, 13 Drawing Sheets

PROVIDE A SUBSTRATE HAVING A PATTERNED STRUCTURE COMPRISING SEMICONDUCTOR MATERIALS, WHEREIN THE PATTERNED STRUCTURE HAS A SIDE PROFILE INCLUDING INDENTATIONS, AND WHEREIN A SPACER LAYER IS CONFORMALLY DEPOSITED OVER THE PATTERNED STRUCTURE AND WITHIN THE INDENTATIONS
910

REACT A SURFACE OF THE SPACER LAYER WITH A PLASMA-EXCITED FIRST ETCH GAS TO FORM A REACTED LAYER ON THE SPACER LAYER, WHEREIN THE PLASMA-EXCITED FIRST ETCH GAS INCLUDES FLUORINE, HYDROGEN, AND NITROGEN
920

REMOVE AT LEAST PART OF THE REACTED LAYER BY ION BOMBARDMENT FROM EXPOSURE TO A PLASMA-EXCITED SECOND ETCH GAS
930

(51) Int. Cl.

| | |
|---|---|
| *H10D 64/01* | (2025.01) |
| *H10P 50/28* | (2026.01) |
| *H01J 37/32* | (2006.01) |

(52) U.S. Cl.
CPC ......... *H10D 64/021* (2025.01); *H10P 50/283* (2026.01); *H01J 37/32091* (2013.01); *H01J 2237/3344* (2013.01)

(56) References Cited

U.S. PATENT DOCUMENTS

| | | |
|---|---|---|
| 2017/0236719 A1 | 8/2017 | O'Meara |
| 2019/0165133 A1 | 5/2019 | Jhan |
| 2022/0189771 A1 | 6/2022 | Lee |
| 2022/0254645 A1* | 8/2022 | Luan ..................... H10P 50/242 |

OTHER PUBLICATIONS

Saito, Makoto et al., "A Highly Selective Photoresist Ashing Process for Silicon Nitride Films by Addition of Trifluoromethane," The Japan Society of Applied Physics, Jpn. J. Appl. Phys. Vol. 40 (2001) pp. 5271-5274, Part 1, No. 9A, Sep. 2001, accepted for publication Jun. 4, 2001.

Shinoda, Kazunori et al., "Thermal cyclic etching of silicon nitride using formation and desorption of ammonium fluorosilicate," Applied Physics Express, 2016 Appl. Phys. Express 9 106201, Sep. 9, 2016, 4 pages.

Wang, Ying et al., "Ultrahigh-selectivity silicon nitride etch process using an inductively coupled plasma source," Research Article | May 1, 1998, Journal of Vacuum Science and Technology, J. Vac. Sci. Technol. A 16, 1582-1587 (1998), Jan. 5, 1998, 7 pages.

Davis, Shannon, "IBM Announces 2nm GAA-FET Technology—the Sum of "Aha!" Moments," Semiconductor Digest, Jun. 3, 2021, 12 pages.

International Search Report and Written Opinion, PCT Application No. PCT/US2024/025000, mailed Aug. 7, 2024, 10 pages.

Kal, S et al., TEL Technology Center, America, LLC imec, "Selective isotropic etching of Group IV semiconductors to enable gate all around device architectures," SPCC, Apr. 10, 2018, 17 pages.

* cited by examiner

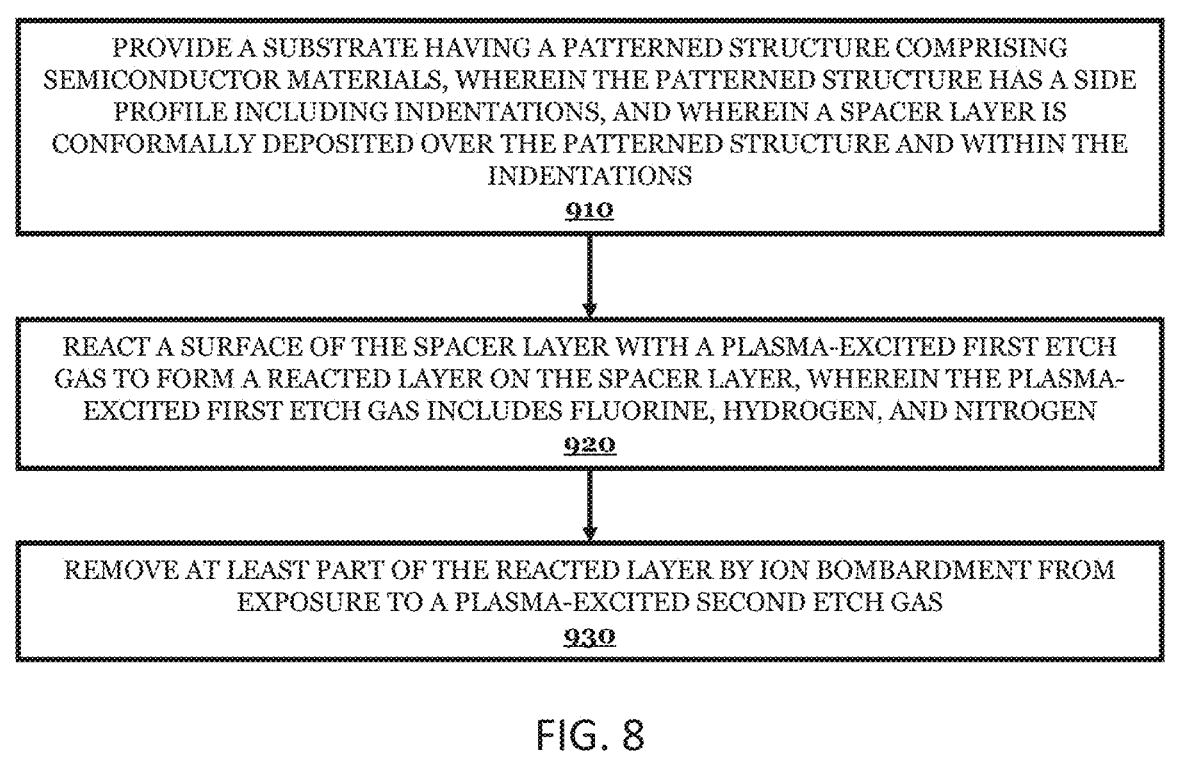

PROVIDE A SUBSTRATE HAVING A PATTERNED STRUCTURE COMPRISING
SEMICONDUCTOR MATERIALS, WHEREIN THE PATTERNED STRUCTURE HAS A SIDE
PROFILE INCLUDING INDENTATIONS, AND WHEREIN A SPACER LAYER IS
CONFORMALLY DEPOSITED OVER THE PATTERNED STRUCTURE AND WITHIN THE
INDENTATIONS
910

REACT A SURFACE OF THE SPACER LAYER WITH A PLASMA-EXCITED FIRST ETCH
GAS TO FORM A REACTED LAYER ON THE SPACER LAYER, WHEREIN THE PLASMA-
EXCITED FIRST ETCH GAS INCLUDES FLUORINE, HYDROGEN, AND NITROGEN
920

REMOVE AT LEAST PART OF THE REACTED LAYER BY ION BOMBARDMENT FROM
EXPOSURE TO A PLASMA-EXCITED SECOND ETCH GAS
930

FIG. 8

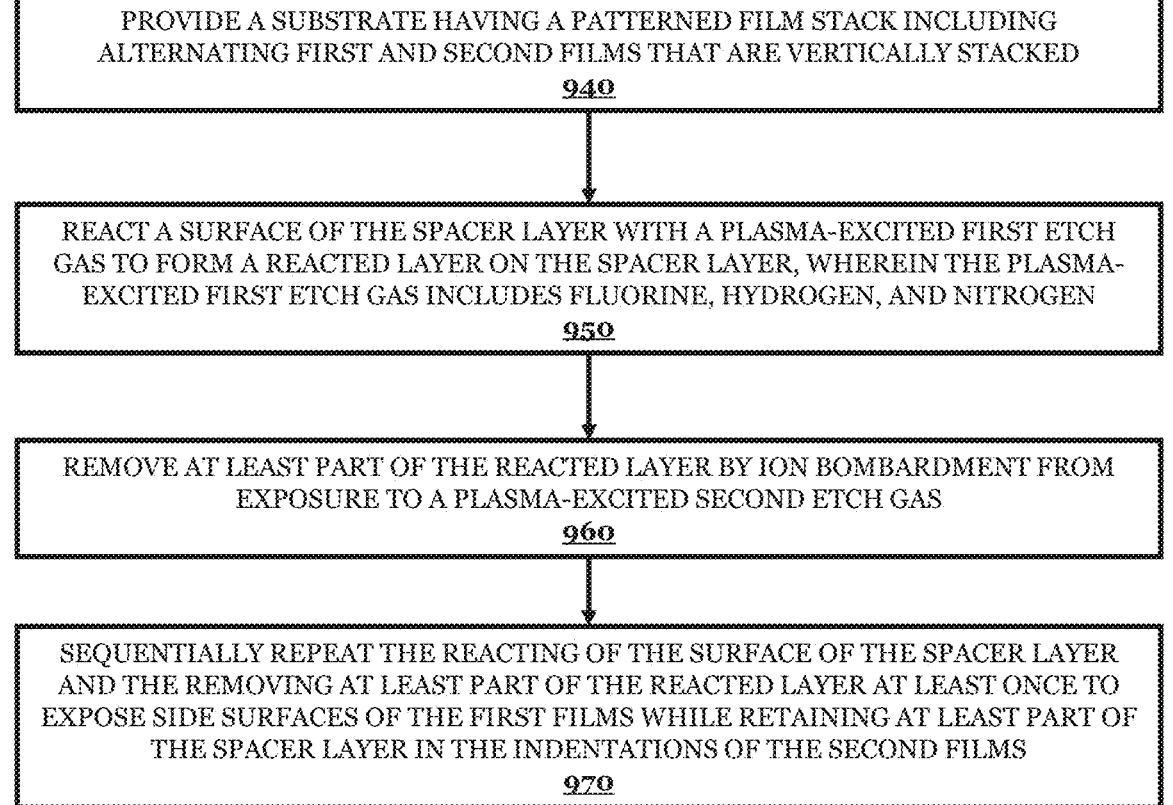

PROVIDE A SUBSTRATE HAVING A PATTERNED FILM STACK INCLUDING ALTERNATING FIRST AND SECOND FILMS THAT ARE VERTICALLY STACKED
940

REACT A SURFACE OF THE SPACER LAYER WITH A PLASMA-EXCITED FIRST ETCH GAS TO FORM A REACTED LAYER ON THE SPACER LAYER, WHEREIN THE PLASMA-EXCITED FIRST ETCH GAS INCLUDES FLUORINE, HYDROGEN, AND NITROGEN
950

REMOVE AT LEAST PART OF THE REACTED LAYER BY ION BOMBARDMENT FROM EXPOSURE TO A PLASMA-EXCITED SECOND ETCH GAS
960

SEQUENTIALLY REPEAT THE REACTING OF THE SURFACE OF THE SPACER LAYER AND THE REMOVING AT LEAST PART OF THE REACTED LAYER AT LEAST ONCE TO EXPOSE SIDE SURFACES OF THE FIRST FILMS WHILE RETAINING AT LEAST PART OF THE SPACER LAYER IN THE INDENTATIONS OF THE SECOND FILMS
970

FIG. 9

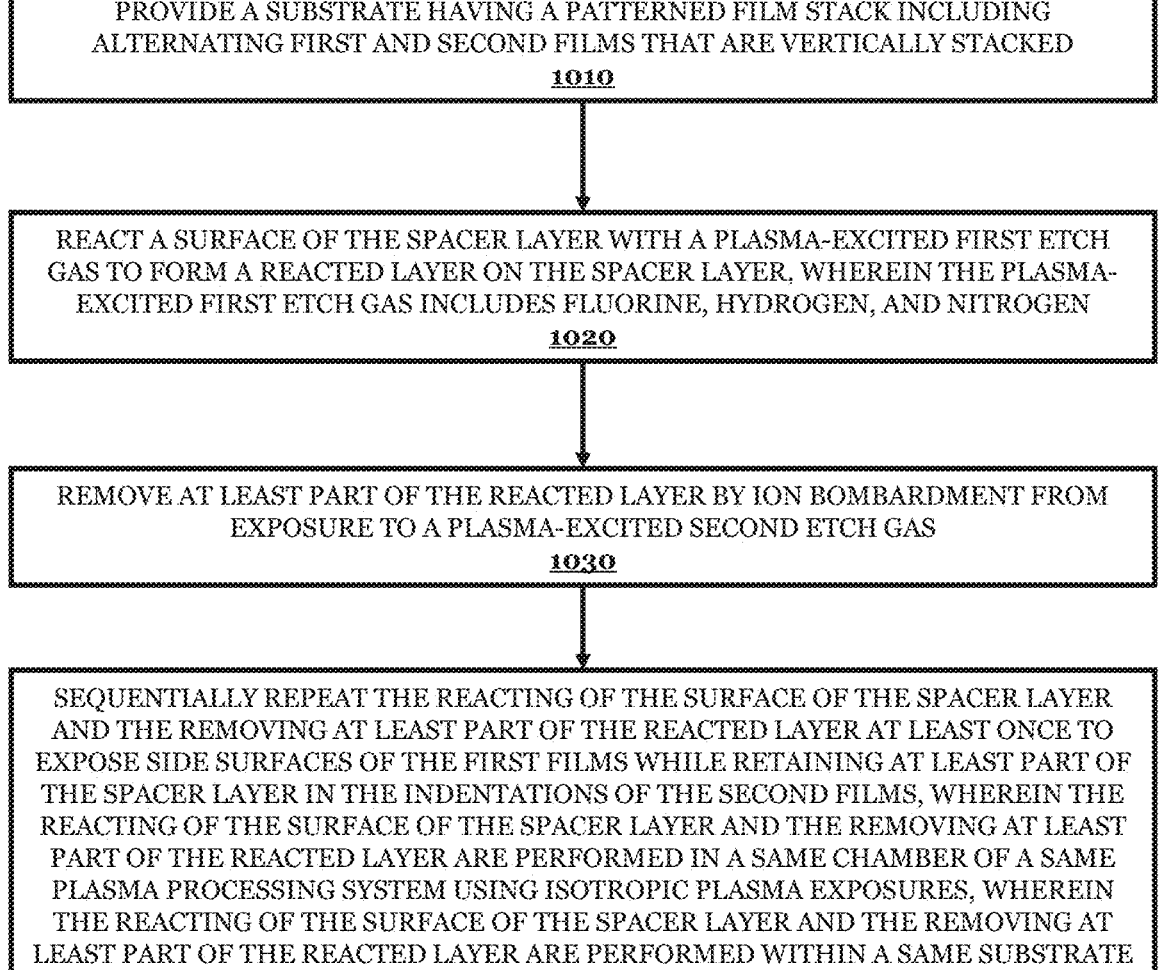

PROVIDE A SUBSTRATE HAVING A PATTERNED FILM STACK INCLUDING ALTERNATING FIRST AND SECOND FILMS THAT ARE VERTICALLY STACKED
1010

REACT A SURFACE OF THE SPACER LAYER WITH A PLASMA-EXCITED FIRST ETCH GAS TO FORM A REACTED LAYER ON THE SPACER LAYER, WHEREIN THE PLASMA-EXCITED FIRST ETCH GAS INCLUDES FLUORINE, HYDROGEN, AND NITROGEN
1020

REMOVE AT LEAST PART OF THE REACTED LAYER BY ION BOMBARDMENT FROM EXPOSURE TO A PLASMA-EXCITED SECOND ETCH GAS
1030

SEQUENTIALLY REPEAT THE REACTING OF THE SURFACE OF THE SPACER LAYER AND THE REMOVING AT LEAST PART OF THE REACTED LAYER AT LEAST ONCE TO EXPOSE SIDE SURFACES OF THE FIRST FILMS WHILE RETAINING AT LEAST PART OF THE SPACER LAYER IN THE INDENTATIONS OF THE SECOND FILMS, WHEREIN THE REACTING OF THE SURFACE OF THE SPACER LAYER AND THE REMOVING AT LEAST PART OF THE REACTED LAYER ARE PERFORMED IN A SAME CHAMBER OF A SAME PLASMA PROCESSING SYSTEM USING ISOTROPIC PLASMA EXPOSURES, WHEREIN THE REACTING OF THE SURFACE OF THE SPACER LAYER AND THE REMOVING AT LEAST PART OF THE REACTED LAYER ARE PERFORMED WITHIN A SAME SUBSTRATE TEMPERATURE RANGE FROM 8 TO 28 DEGREES CELSIUS
1040

FIG. 10

METHOD FOR ION-ASSISTED SELF-LIMITED CONFORMAL ETCH

CROSS-REFERENCE TO RELATED APPLICATIONS

This application claims the benefit of U.S. Provisional Application No. 63/465,436, filed on May 10, 2023, which application is hereby incorporated herein by reference.

TECHNICAL FIELD

The present disclosure relates generally to methods for manufacturing semiconductor devices, and more particularly, ion-assisted self-limited conformal etch in a method for manufacturing semiconductor devices.

BACKGROUND

Traditional plasma etch approaches for structures with advanced geometries, such as nanosheet and nanowire transistors, present issues with top versus bottom etch variations (deltas) and isolated versus nested area etch variations (deltas), as well as excess etching in the nanosheet area, all of which can lead to poor epitaxial growth of source and drains and can result in device failure.

FIGS. 1A to 1C are cross-section views showing common problems for etching film structures with advanced geometries. More specifically, FIGS. 1A to 1C show intermediate structures during semiconductor processing to form gate-all-around nanosheet channel transistors. A film structure such as a patterned film stack 20 can include alternating vertically stacked films of silicon germanium (SiGe) and silicon (Si). The SiGe layers 30 can be selectively etched, relative to the Si channel layers 40, so that the SiGe layers 30 have indentations 32. A spacer layer 50 can be deposited conformally over the patterned film stack 20 so that it fills the indentations 32 and covers the intermediate structures. Thereafter, the spacer layer 50 can be etched to expose alternating nanowires or nanosheets. That is, a goal at this stage is to expose side surfaces 42 of the Si channel layers 40 for a subsequent epitaxial growth of source and drain regions, while retaining the material of the spacer layer 50 covering the indentations 32 of SiGe layers 30, often referred to as inner spacers.

FIG. 1A shows an isolated versus nested area etch problem for which the sidewall etch rate of the spacer layer 50 is lower in the nested area 61 than in the isolated area 62. FIG. 1B shows top versus bottom etch problem for which the etch rate of the spacer layer 50 is less near the bottom or at a lower region 63 of the intermediate structure than near the top or at an upper region 64 of the intermediate structure. FIG. 1C shows an etch problem for which the etch rate of the spacer layer 50 is greater near the bottom or at a lower region 63 of the intermediate structure at the patterned film stack 20 than near the top or at an upper region 64 of the intermediate structure, resulting in excess spacer loss in the recesses, at the indentations 32 of the SiGe layers 30, between adjacent nanosheets or between the Si channel layers 40.

Following the etching of the patterned film stacks 20, high quality epitaxial growth of source and drains requires that the spacer layer 50 is sufficient etched to expose tips of silicon nanosheets or side surfaces 42 of the Si channel layers 40 in all areas (upper and lower) of the patterned film stack 20, that the exposed tips of the silicon nanosheets are not damaged by the etch process, that sufficient spacer layer thickness is retained at the top of the patterned structure to protect the polysilicon dummy gate structure 70 from epitaxial growth, and that sufficient spacer layer thickness (inner spacers) is retained between the nanosheets for isolation and structural integrity.

Thus, new etching methods are needed that address these problems in etching of patterned film structures.

SUMMARY

In accordance with an embodiment of the present disclosure, a method for forming a semiconductor device can include: providing a substrate having a patterned structure comprising semiconductor materials, where the patterned structure has a side profile including indentations, and where a spacer layer is conformally deposited over the patterned structure and within the indentations; reacting a surface of the spacer layer with a plasma-excited first etch gas to form a reacted layer on the spacer layer, where the plasma-excited first etch gas includes fluorine, hydrogen, and nitrogen; and removing at least part of the reacted layer by ion bombardment from exposure to a plasma-excited second etch gas.

In accordance with an embodiment of the present disclosure, a method for forming a semiconductor device can include: providing a substrate having a patterned film stack including alternating first and second films that are vertically stacked, where the first films have a first outer dimension, where the second films have a second outer dimension, where the second films have indentations so that the second outer dimension of the second films is smaller than the first outer dimension of the first films, where a spacer layer is conformally deposited over the patterned film stack and within the indentations in the second films, and where the spacer layer comprises a silicon-carbon-containing material, a silicon-oxygen-containing material, or a silicon-carbon-oxygen-containing material; reacting a surface of the spacer layer with a plasma-excited first etch gas to form a reacted layer on the spacer layer, where the plasma-excited first etch gas includes fluorine, hydrogen, and nitrogen, where the reacted layer comprises ammonium fluorosilicate (AFS); removing at least part of the reacted layer by ion bombardment from exposure to a plasma-excited second etch gas; and sequentially repeating the reacting of the surface of the spacer layer and the removing at least part of the reacted layer at least once to expose side surfaces of the first films while retaining at least part of the spacer layer in the indentations of the second films.

In accordance with an embodiment of the present disclosure, a method for forming a semiconductor device can include: providing a substrate having a patterned film stack including alternating first and second films that are vertically stacked, where the first films have a first outer dimension, where the second films have a second outer dimension, where the second films have indentations so that the second outer dimension of the second films is smaller than the first outer dimension of the first films, where a spacer layer is conformally deposited over the patterned film stack and within the indentations in the second films, and where the spacer layer comprising SiOCN; reacting a surface of the spacer layer with a plasma-excited first etch gas to form a reacted layer on the spacer layer, where the plasma-excited first etch gas includes fluorine, hydrogen, and nitrogen, where the reacted layer comprises ammonium fluorosilicate (AFS); removing at least part of the reacted layer by ion bombardment from exposure to a plasma-excited second etch gas; and sequentially repeating the reacting of the surface of the spacer layer and the removing at least part of the reacted layer at least once to expose side surfaces of the first films while retaining at least part of the spacer layer in the indentations of the second films, where the reacting of the surface of the spacer layer and the removing at least part of the reacted layer are performed in a same chamber of a same plasma processing system using isotropic plasma exposures, where the reacting of the surface of the spacer layer and the removing at least part of the reacted layer are performed within a same substrate temperature range from 8 to 28 degrees Celsius.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 8 illustrates a flow chart implementing the ion-assisted self-limited conformal etch in accordance with an embodiment of the present disclosure;

FIG. 9 illustrates a flow chart implementing the ion-assisted self-limited conformal etch in accordance with an embodiment of the present disclosure; and FIG. 10 illustrates a flow chart implementing the ion-assisted self-limited conformal etch in accordance with an embodiment of the present disclosure.

DETAILED DESCRIPTION OF ILLUSTRATIVE EMBODIMENTS

Figure 1A:
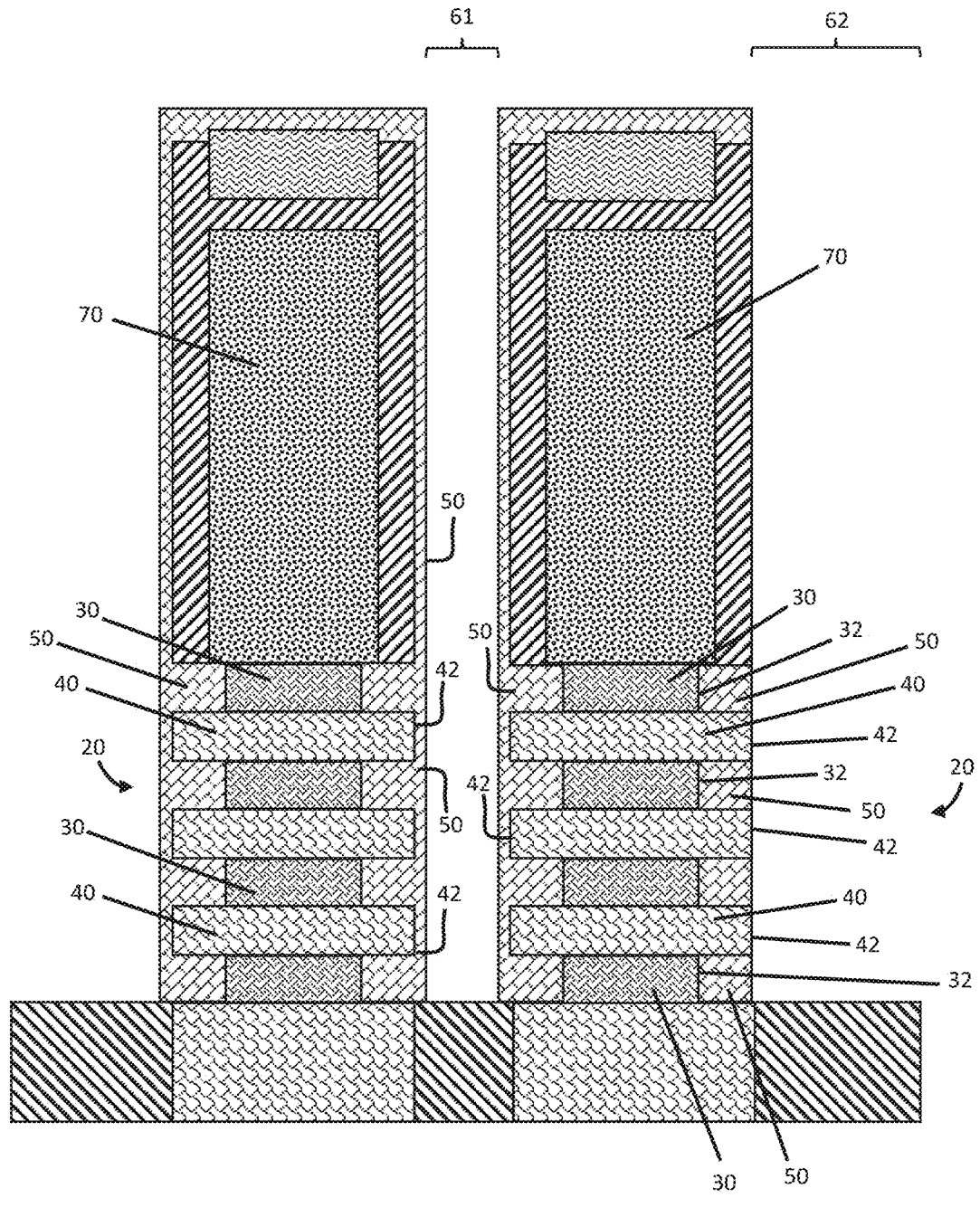
FIGS. 1A to 1C are cross-section views illustrating intermediate structures of semiconductor devices made using methods according to the prior art.

Referring now to the drawings, in which like reference numbers can be used herein to designate like or similar elements throughout the various views, illustrative and example embodiments are shown and described. The figures are not drawn to scale, and in some instances the drawings are exaggerated or simplified in places for illustrative purposes. One of ordinary skill in the art can appreciate many possible applications and variations for other embodiments based on the following illustrative and example embodiments provided in the present disclosure.

In some embodiments of the present disclosure, a method for forming intermediate structures during the manufacturing of a semiconductor device includes providing a substrate having a patterned structure comprising semiconductor materials, where the patterned structure has a side profile including indentations, such as a patterned film stack for making transistors, conformally depositing a spacer layer over the patterned structure and within the indentations, reacting a surface of the spacer layer with a plasma-excited first etch gas to form a reacted layer on the spacer layer, and removing at least part of the reacted layer by ion bombardment from exposure to a plasma-excited second etch gas. In some embodiments, the reacting to form a reacted layer and the removing of the reacted layer may be repeated and cycled until a desired amount of the spacer layer is removed. Some example embodiments of the present disclosure are described in more detail below with reference to the drawings in the present disclosure, to describe some example variations for some embodiments of the present disclosure. Other embodiments can also be understood from the entirety of the specification and the claims filed herein.

In the present disclosure, terms such as "first", "second", and the like, may be used to describe various components, but the components are not necessarily limited by such terms, for example, regarding order, sequence, importance, or number of such components possible in an embodiment. Such terms can be used merely for the purpose of distinguishing one component from other components in a given embodiment or group of embodiments. For example, a first component may be referred to as a second component, and similarly, a second component may also be referred to as a first component without departing from the scope of rights according to the present disclosure. Because semiconductor geometries and sizes can be so extremely small (e.g., on the order of 1 to 5 nm), the terms "film" and "layer" may be used interchangeably herein.

For simplification and illustration purposes, FIGS. 2A to 5 are merely showing some portions of a substrate for a semiconductor device as intermediate structures that can be relevant to a method of making a semiconductor device according to some embodiments of the present disclosure. Accordingly, in FIGS. 2A to 5, to simplify the drawings, as can be readily understood by one of ordinary skill in the pertinent art, additional layers and structures of a substrate for a semiconductor made before, under, below, or adjacent the intermediate structures shown in the drawings can be omitted and not shown, which can include any structures, types, and semiconductor devices, such as additional frontend-of-line (FEOL) stage(s) or level(s), additional transistors, diodes, capacitors, resistors, inductors, integrated circuits, memory cells, logic, processor portions, digital devices, analog devices, bipolar devices, power devices, mixed-signal devices, radio frequency devices, buried oxide layer(s), additional shallow trench isolation region(s), full semiconductor wafer, or any combination thereof, for example. And accordingly, in FIGS. 2A to 5, to simplify the drawings, as can be readily understood by one of ordinary skill in the pertinent art, additional layers and structures of a substrate for a semiconductor device made after, over, above, or adjacent the intermediate structures shown in the drawings can be omitted and not shown, which can include any structures, types, and semiconductor devices, such as additional frontend-of-line (FEOL) stage(s) or level(s), additional transistors, diodes, capacitors, resistors, inductors, integrated circuits, memory cells, logic, processor portions, digital devices, analog devices, bipolar devices, power devices, mixed-signal devices, radio frequency devices, interconnects, vias, trenches, interlayer dielectric layers, intermetal dielectric layers, backend-of-line (BEOL) stages or levels, passivation layers, contact pads, local interconnects, global interconnects, wire bonding, packaging, or any combination thereof, for example. Furthermore, in an actual completed semiconductor device cross-section, the intermediate structures, or remnants thereof, that are illustrated and represented in the drawings of the present disclosure in a simplified manner as having squared edges, rectangular block shapes, and/or linear shapes can be actually more rounded, more curved shaped, and less linear shaped, and can be perhaps even difficult to visually see even in an image taken with a scanning electron microscope (SEM) or a transmission electron microscope (TEM) due the extremely small size, thickness, and scale of some layers and resulting features (e.g., some on the scale of less than 5 nanometers in size).

Figure 2A:
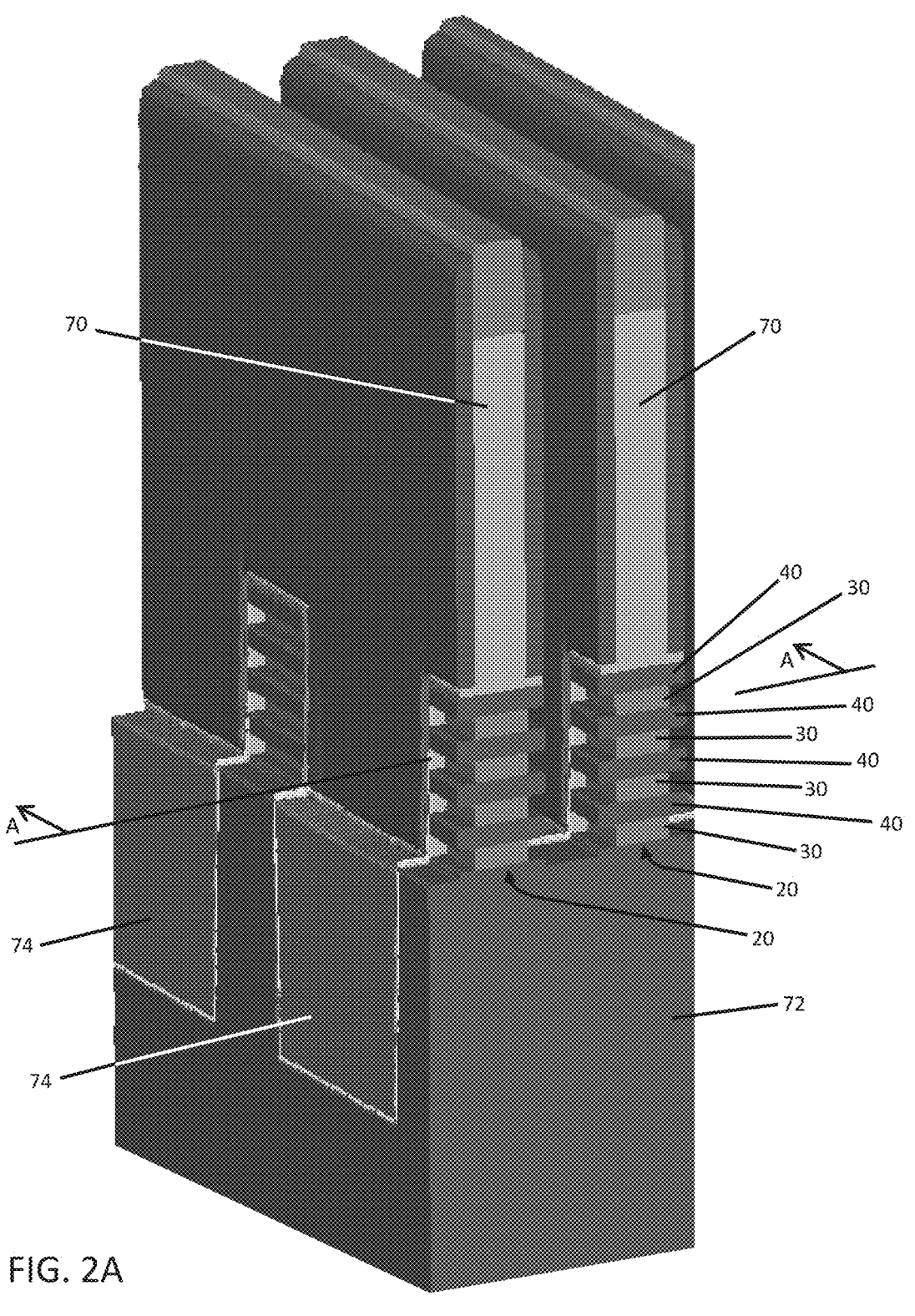
FIGS. 2A and 2B are perspective cutaway views showing a portion of an intermediate structure of a semiconductor device having alternating vertically stacked films.

FIGS. 2A to 5 are various views of various intermediate structures of an example semiconductor device, schematically showing a processing sequence for forming the intermediate structures of the example semiconductor device using methods according to some embodiments of the present disclosure. In FIGS. 2A to 5, the example semiconductor device being built includes alternating vertically stacked films (e.g., SiGe and Si films stacked) for making gate-all-around stacked nanosheet channels for transistors. More specifically, FIG. 2A is perspective cutaway view showing a portion of an intermediate structure of the example semiconductor device being made using methods according to some embodiments of the present disclosure. FIGS. 2B to 5 are cross-section views taken from a perspective of line A-A in FIG. 2A, illustrating intermediate structures of the example semiconductor device being made using methods according to some embodiments of the present disclosure. However, some embodiments of the present disclosure can be used for making other structures for other semiconductor devices.

Figure 2B:
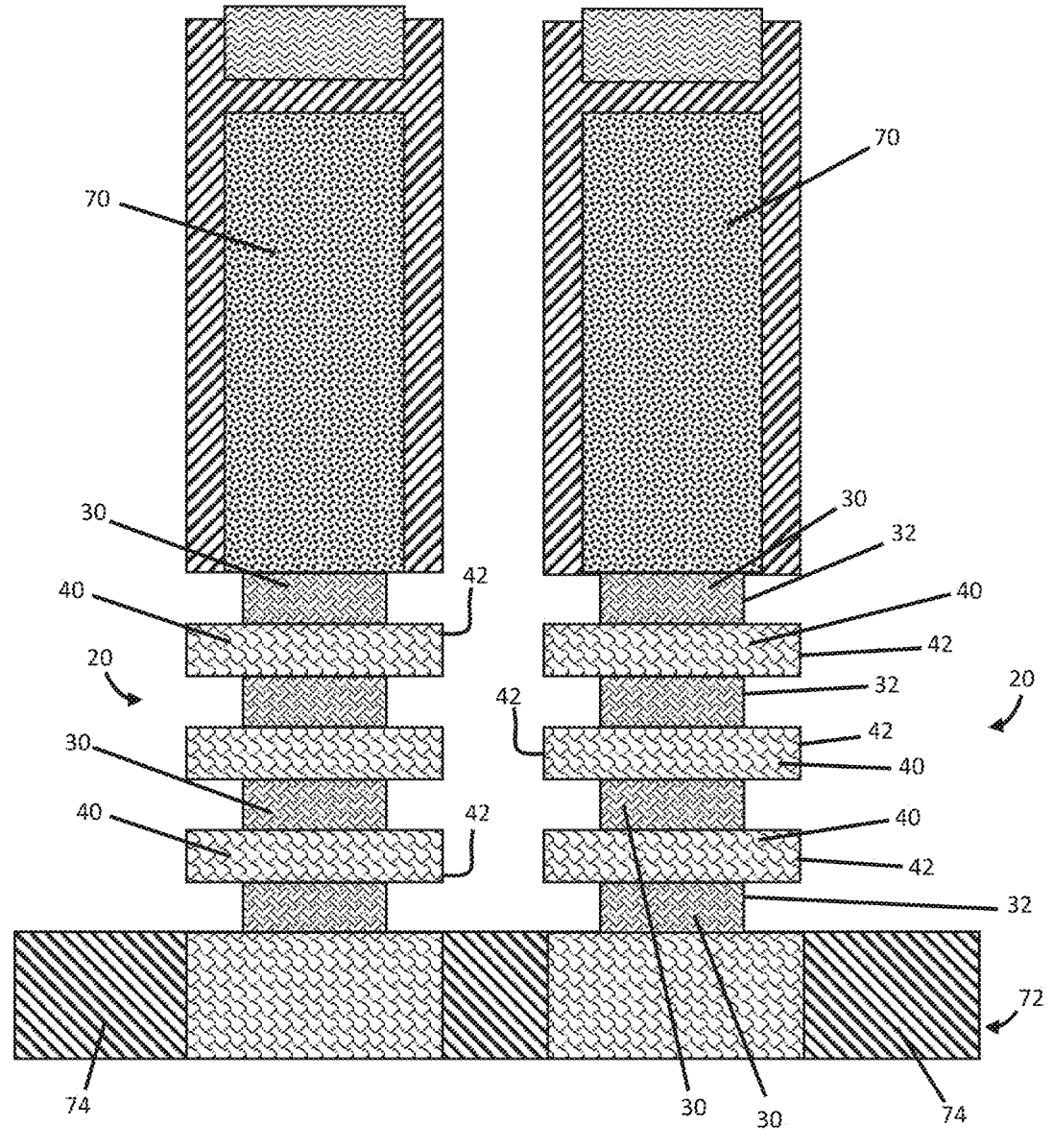

FIG. 2B is a cross-section view of FIG. 2A taken along line A-A. Referring to FIGS. 2A and 2B, an intermediate structure can include alternating vertically stacked films or a patterned film stack 20 of SiGe layers 30 (e.g., sacrificial SiGe layers) and Si channel layers 40 formed over a wafer 72, shallow trench isolation 74 formed in the wafer 72, and a polysilicon dummy gate structure 70. Polysilicon dummy gate structure 70 can include dielectric layer(s) (e.g., silicon oxide, SiO2) around the top and sides of a polysilicon layer. The polysilicon dummy gate structure 70 can act as hard mask at this intermediate stage. The SiGe layers 30 are selectively etched relative to the Si channel layers 40 so that the SiGe layers 30 have indentations 32 and are recessed relative to the Si channel layers 40. The Si channel layers 40 can have a first outer dimension while the SiGe layers 30 have a second outer dimension at the indentations 32 of the SiGe layers 30, where the second outer dimension is smaller than the first outer dimension.

Figure 3:
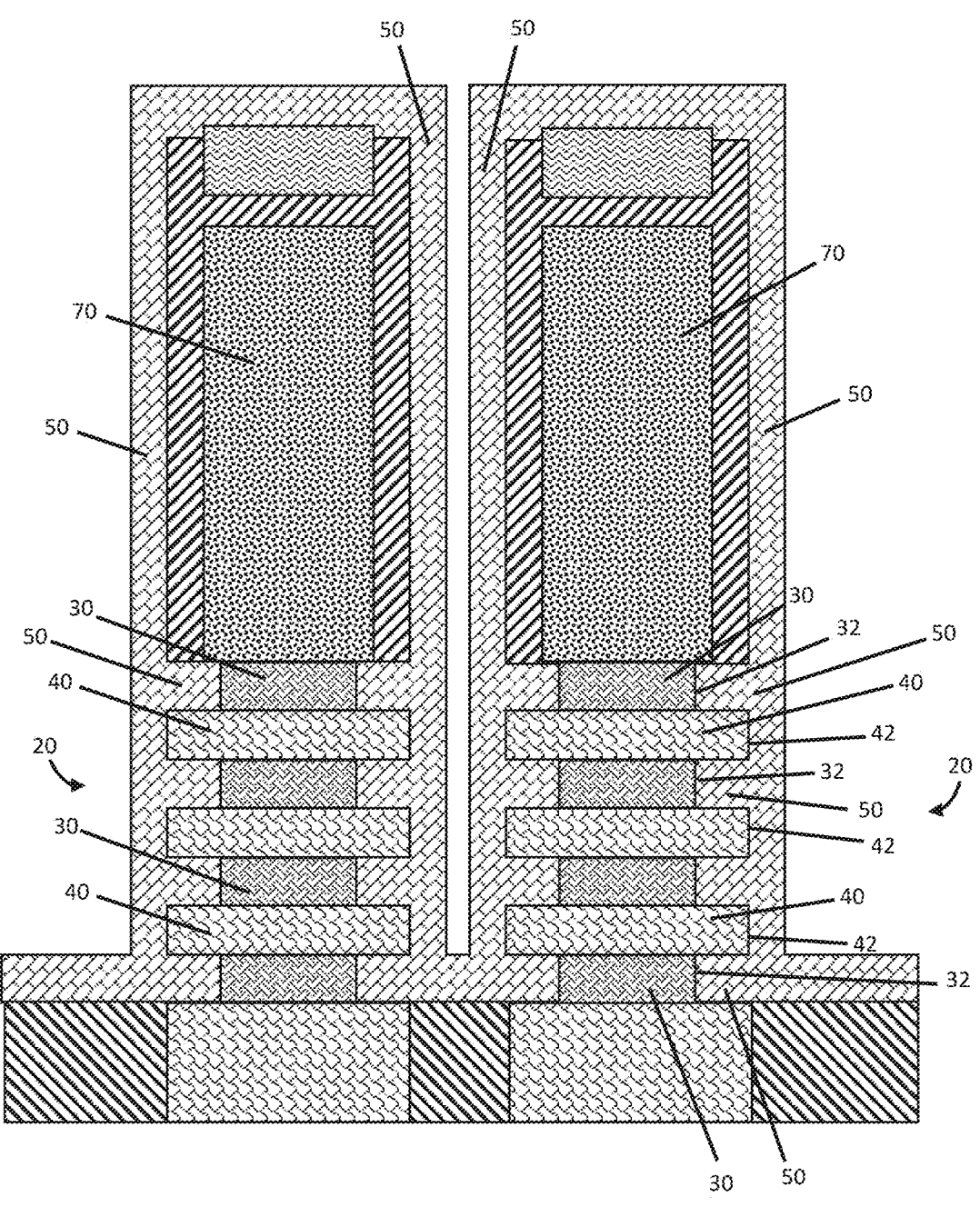
FIGS. 3 to 5 are cross-section views illustrating intermediate structures of a semiconductor device made using methods according to some embodiments of the present disclosure.

Referring to FIG. 3, a spacer layer 50 can be conformally deposited over the patterned film stack 20 and within the indentations 32 in or at the SiGe layers 30 between tips of the Si channel layers 40. The spacer layer 50 can be conformally deposited over the patterned film stack 20 including the side surfaces of the alternating SiGe layers 30 and Si channel layers 40, where the spacer layer 50 overfills the indentations 32 between adjacent Si channel layers 40. The spacer layer 50 can completely fill the indentations 32 and can then also overfills the indentations 32. In some embodiments, the spacer layer 50 can include a silicon-carbon-containing material, a silicon-nitrogen-containing material, a silicon-oxygen-containing material, a silicon-carbon-oxygen-containing material, or any combination thereof. In some embodiments, the spacer layer 50 contains SiO2, SiC, SiN, SiOC, SiOCN, or any combination thereof. In some embodiments, the spacer layer 50 contains a low-k dielectric material. In one example, the spacer layer 50 contains SiOCN material. The spacer layer 50 can have a thickness between about 5 nm and about 20 nm, for example. The spacer layer can be deposited by chemical vapor deposition (CVD), plasma-enhanced chemical vapor deposition (PECVD), atomic layer deposition (ALD), plasma-enhanced atomic layer deposition (PEALD), or any combination thereof, for example.

Figure 4:
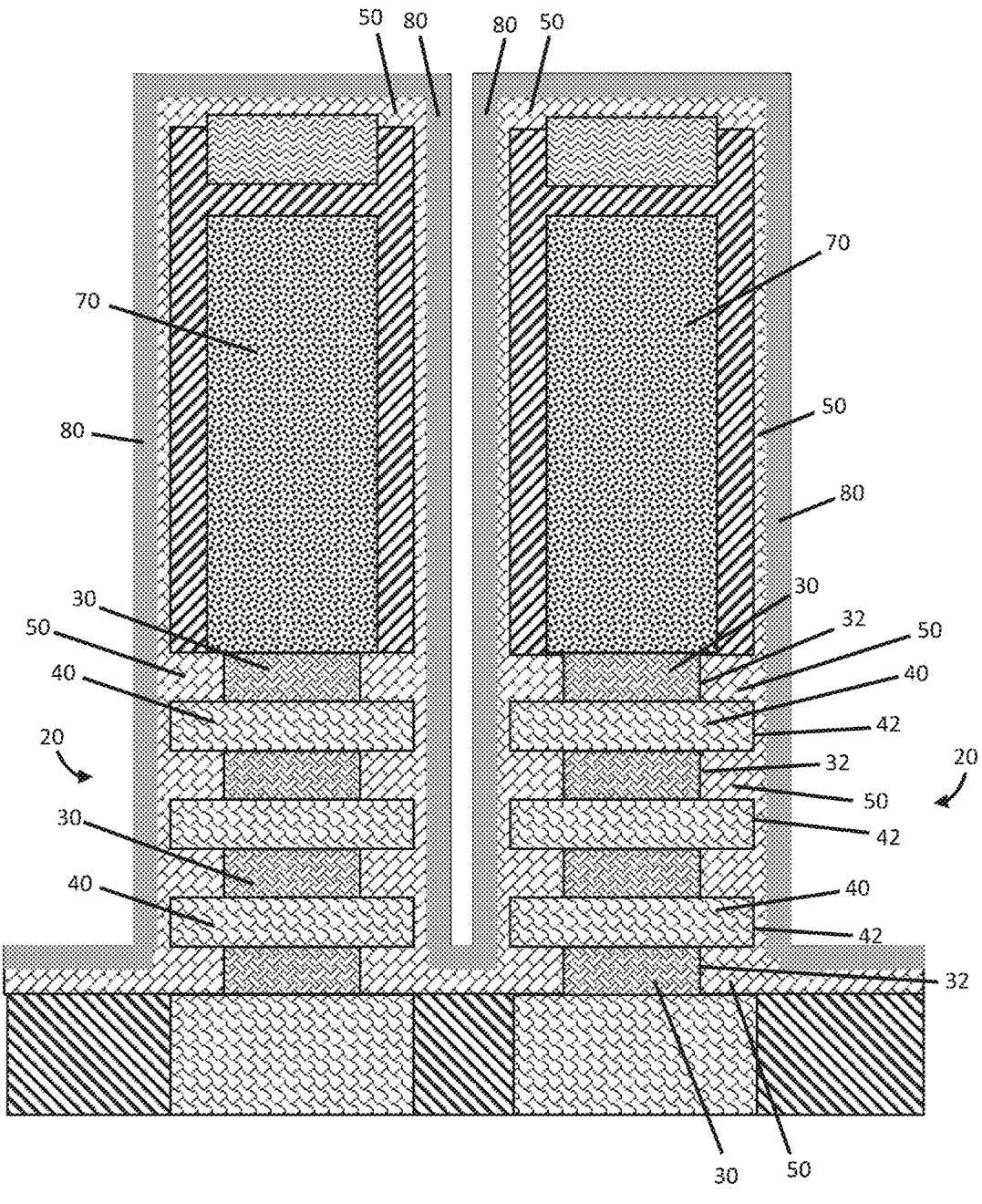

Referring to FIG. 4, according to a method of an embodiment of the present disclosure, exposed surfaces of the spacer layer 50 can be reacted with a plasma-excited first etch gas in a chamber of a plasma processing system to form a reacted layer 80 on the spacer layer 50. Such reacted layer 80 can have a thickness of about 1 nm to 3 nm, for example. In some embodiments, the plasma-excited first etch gas can contain fluorine and nitrogen. In some embodiments, the plasma-excited first etch gas can contain fluorine, hydrogen, and nitrogen. In some embodiments, the plasma-excited first etch gas can include $SF_6$, $NF_3$, $N_2$, $H_2$, $NH_3$, HF, $CF_4$, $CHF_3$, $CH_2F_2$, $CH_3F$, or any combination thereof. In one example, the plasma-excited first etch gas contains $SF_6$, $H_2$, and $N_2$. In another example, the plasma-excited first etch gas contains $NF_3$, $H_2$, and $N_2$. Accordingly, the reacted layer 80 can be or can include an ammonium fluorosilicate $((NH_4)_2SiF_6)$ (AFS) layer. In some embodiments, the reacted layer 80 can be or can include a salt layer (modified surface layer) on the spacer layer 50.

In some embodiments, the formation of the reacted layer 80 can be self-limiting or quasi self-limiting, such that as a certain thickness of the reacted layer 80 is reached (e.g., between about 1 nm and 3 nm), the reacted layer 80 can prevent further reaction of the plasma-excited first etch gas with remaining underlying (non-exposed) unreacted portions of the spacer layer 50. In some embodiment, the self-limiting characteristics of the formation of the reacted layer 80 can result in the reacted layer having a uniform thickness over the entire patterned film stack 20 and/or over the entire intermediate structure, which can be advantageous for providing a uniform etching or thinning of the spacer layer 50 as a uniform conformal etching process.

Figure 5:
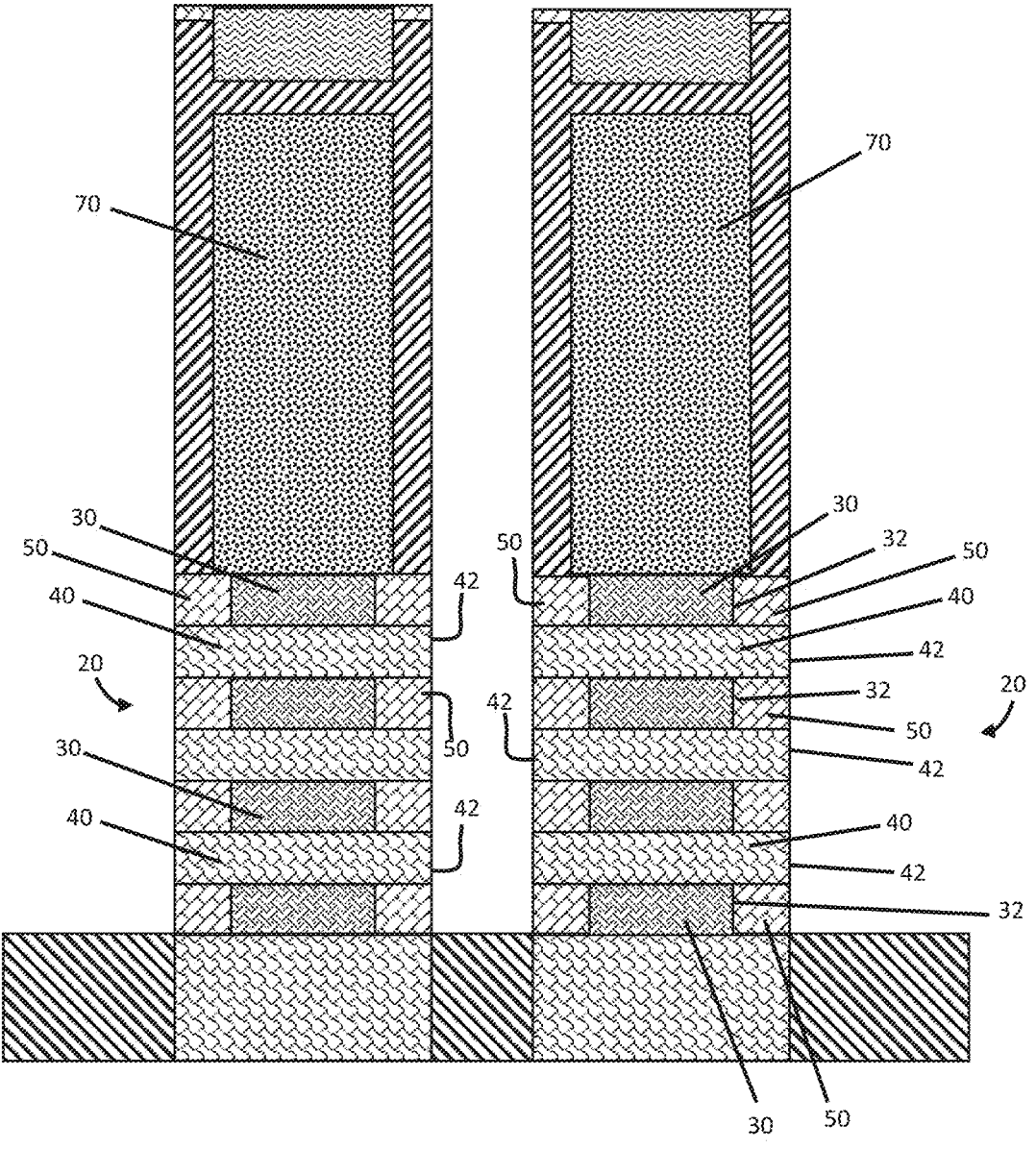

Referring to FIG. 5, according to a method of an embodiment of the present disclosure, part of, most of, or all of the reacted layer 80 can be removed by ion bombardment from exposure to a plasma-excited second etch gas. The plasma-excited second etch gas can include $N_2$, $H_2$, $O_2$, Ar, CO, He, Kr, Xe, or any combination thereof. The removal of the reacted layer 80 can reduce the thickness of the spacer layer 50. In some embodiments, the removal of the reacted layer 80 exposes side surfaces 42 of the Si channel layers 40 while retaining at least part of the spacer layer 50 in the indentations 32 of the SiGe layers 30, forming an inner spacer between the tips of the Si channel layers 40. The inner spacer can provide structural support for the tips of the Si channel layers 40, as well as electrical isolation because the inner spacer is typically a dielectric material.

Exposing the side surfaces 42 of the Si channel layers 40 can be a goal for this intermediate structure for a patterned film stack 20 (see e.g., FIG. 5) in preparation for next operations of epitaxially growing and/or depositing source and drain regions that are electrically connected to the Si channel layers 40 via these side surfaces 42, for example. Depending on the several factors, such as a thickness of the spacer layer 50, a nested spacing between structures, material choices, reaction time permitted, and parameters of the plasma processing system (e.g., plasma source type, gas(es) selection, power levels, RF bias, gas(es) flow rate(s)), for example, the operations of reacting a surface of the spacer layer 50 with a plasma-excited first etch gas to form the reacted layer 80 and removal of the reacted layer 80 can vary an amount or thickness of the spacer layer removed. In some cases, the reacting and removal operations can be sequentially repeated or cycled one or more times until the side surfaces 42 of the Si channel layers 40 are exposed, fully exposed, or even also partially exposing a top and/or bottom surface of the Si channel layers 40 (i.e., reducing a size of the inner spacers) while retaining at least part of the spacer layer 50 in the indentations 32 of the SiGe layers 30 (i.e., to form the inner spacers). In some embodiments, the operations of the reacting of the surface of the spacer layer to form the reacted layer and the removal of at least part of the reacted layer together can be referred to collectively as a conformal etching process, for example.

Generally, high-quality epitaxial growth for forming source and drain regions subsequent to the intermediate structure shown in FIG. 5, for example, can be achieved if four main factors are fulfilled. First, a sufficient amount of the spacer layer 50 is etched to sufficiently expose tips or side surfaces 42 of the Si channel layers 40 (nanosheets). Second, the exposed tips or side surfaces 42 of the Si channel layers 40 (nanosheets) are not damaged by etch process. Third, a sufficient thickness of the spacer layer 50 is retained at the upper and/or top of the intermediate structure to protect the silicon or polysilicon dummy gate (e.g., protecting the polysilicon dummy gate structure 70) from epitaxial nucleation during the formation of the source and drain regions. Fourth, a sufficient thickness of the spacer layer 50 is retained in the indentations 32 of the SiGe layers 30 (i.e., sufficient inner spacers between the nanosheets) for isolation and structural reliability. Using a method according to an embodiment of the present disclosure can help fulfill these factors by providing a precisely-controlled conformal etching process for the thinning and shaping of the spacer layer 50, for example.

In some embodiments, the operations of reacting to form the reacted layer 80 and removing part of or all of the reacted layer 80 can be performed at a substantially same substrate temperature or within a same range of substrate temperature. For example, the substrate temperature can be about room temperature. For example, the same range of substrate temperature can be from 8 to 28 degrees Celsius, with some margin of about plus or minus 2-3 degrees Celsius on each side of that range.

In some embodiments, the operations of reacting to form the reacted layer 80 and removing the reacted layer 80 can use isotropic plasma exposures. In some embodiments, the operations of reacting to form the reacted layer 80 use an isotropic plasma exposure and the operations of removing the reacted layer 80 can use an anisotropic plasma exposure.

Figure 6:
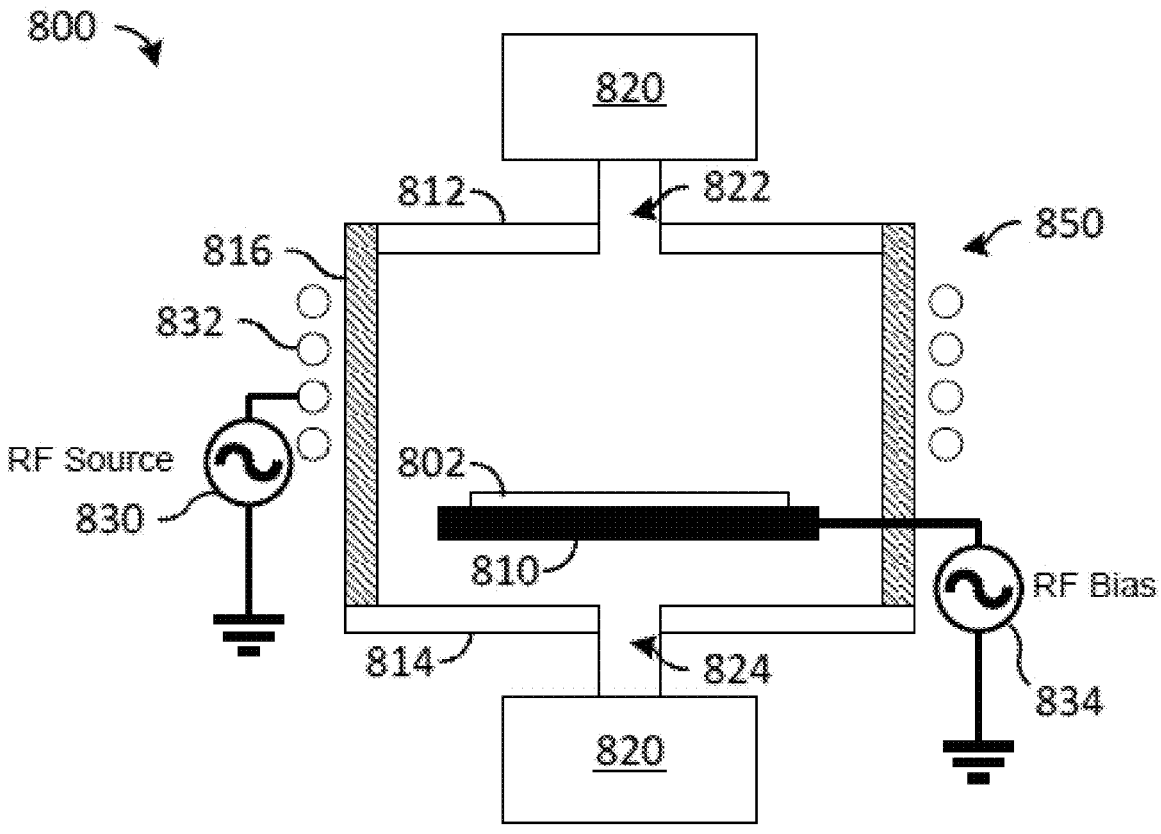
FIG. 6 is a diagram illustrating a chamber of a plasma processing system for implementing methods of manufacturing semiconductor devices according to some embodiments of the present disclosure.

In some embodiments, a substrate containing a patterned film stack can be introduced in a plasma processing chamber containing an inductively coupled plasma (ICP) source. An example plasma processing chamber containing an ICP source is schematically shown in FIG. 6.

In some embodiments, the substrate can be positioned on a substrate holder that is not electrically biased, and thereby can provide sequential isotropic exposures of the patterned film stack to the plasma-excited first etch gas and the plasma-excited second etch gas. Isotropic exposures can be uniform in vertical and horizontal directions on the patterned film stack. Alternatively, the substrate holder can be electrically biased, and thereby can provide anisotropic exposure of the patterned film stack to the plasma-excited second etch gas. The anisotropic exposure can be predominantly in a vertical direction on the patterned film stack (e.g., perpendicular to a wafer surface).

Cyclical formation and subsequent removal of the reacted layer described above can enable controlled removal of a thickness of the spacer layer in each etch cycle. The exposures to the plasma-excited first etch gas and the plasma-excited second etch gas can be isotropic (i.e., no electrical bias on the substrate holder) to provide uniform vertical and horizontal etching of the spacer layer, In some embodiments, using isotropic exposure for the plasma-excited first etch gas and the plasma-excited second etch gas can result in no excess upper region versus lower region removal variations (or at least minimal or reduced upper region versus lower region removal variations, e.g., compared to currently best known methods) and/or no excess isolated region versus nested region variations (or at least minimal or reduced isolated region versus nested region removal variations, e.g., compared to currently best known methods), for the thinning of the spacer layer.

In some embodiments, cyclical formation and subsequent removal of the reacted layer described above can be performed in a single plasma processing chamber where the substrate is maintained at substantially the same substrate temperature during the processing operations. In some embodiments, the substrate holder can be electrically biased (for providing anisotropic plasma exposure) or not electrically biased (for allowing isotropic plasma exposure) during the process operations. An advantage of using a method according to an embodiment of the present disclosure can be reducing the number of substrate transferring steps within a process tool, which can increase process stability and increase substrate throughput.

FIG. 6 is a diagram illustrating a chamber of a plasma processing system 800 that can be used in implementing methods of manufacturing semiconductor devices according to some embodiments of the present disclosure. The plasma processing system 800 can be used for performing plasma etch processes, such as etching a patterned film stack containing a spacer layer, for example. The plasma processing system 800 can have a plasma processing chamber 850 configured to sustain plasma directly above a substrate 802 loaded onto a substrate holder 810. A process gas can be introduced to the plasma processing chamber 850 through a gas inlet 822 and can be pumped out of the plasma processing chamber 850 through a gas outlet 824. The gas inlet 822 and the gas outlet 824 may include a set of multiple gas inlets and gas outlets, respectively. The gas flow rates and chamber pressure can be controlled by a gas flow control system 820 coupled to the gas inlet 822 and the gas outlet 824. The gas flow control system 820 can include various components, such as high pressure gas canisters, valves (e.g., throttle valves), pressure sensors, gas flow sensors, vacuum pumps, pipes, and electronically programmable controllers, for example. A radio frequency (RF) bias power source 834 and an RF source power source 830 can be coupled to respective electrodes of the plasma processing chamber 850. The substrate holder 810 can also be the electrode coupled to the RF bias power source 834 (e.g., for providing an electrically-biased substrate holder). The RF source power source 830 can be coupled to a helical electrode 832 coiled around a dielectric sidewall 816. The gas inlet 822 can be an opening in a top plate 812. The gas outlet 824 can be an opening in a bottom plate 814. The top plate 812 and bottom plate 814 can be conductive and electrically connected to the system ground (a reference potential).

The plasma processing system 800 is an example only. In various alternative embodiments, the plasma processing system 800 can be configured to sustain inductively coupled plasma (ICP) with RF source power coupled to a planar coil over a top dielectric cover, or capacitively coupled plasma (CCP) sustained using a disc-shaped top electrode in the plasma processing chamber 850. Alternately, other suitable configurations such as electron cyclotron resonance (ECR)

plasma sources and/or a helical resonator can be used. The RF bias power source 834 can be used to supply continuous wave (CW) or pulsed RF power to sustain the plasma. According to some embodiments, the RF bias power source 834 may not be powered so that the substrate holder 810 is not electrically biased. Gas inlets and gas outlets can be coupled to sidewalls of the plasma processing chamber, and pulsed RF power sources and pulsed DC power sources also can be used in some embodiments. In various embodiments, the RF power, chamber pressure, substrate temperature, gas flow rates and other plasma process parameters can be selected in accordance with respective process recipes. For some embodiments, a remote plasma system and/or a batch system may be used. For example, the substrate holder can be configured to support a plurality of wafers that are spun around a central axis as they pass through different plasma zones.

Accordingly, some embodiments of the present disclosure can provide semiconductor processing using existing or newly developed plasma processing systems for enabling a room temperature, self-limited conformal etch of carbon-containing and oxygen-containing materials, with a focus on low-k materials such as SiOCN. In methods according to some embodiments of the present disclosure, etch profile issues present in conventional approaches, such as top/bottom and isolated/nested etch deltas, can be addressed and solved, thereby facilitating high-quality epitaxial growth in advanced structures.

In some embodiments, an ICP reactor can be used to grow ammonium fluorosilicate (AFS) on oxide and oxygen-containing materials, such as SiOCN, of a surface layer to form a modified surface layer, and then the AFS can be sublimated using an ion-assisted process to etch the modified surface layer. In some embodiments, a cyclic pulsed plasma approach can enable highly-controlled conformal etching of or on nanosheet structures. In some embodiments, removal of oxide and oxygen-containing materials can be self-limited to about 1 nm of the surface where the AFS grows on the surface and is then removed in a subsequent step.

Figure 7:
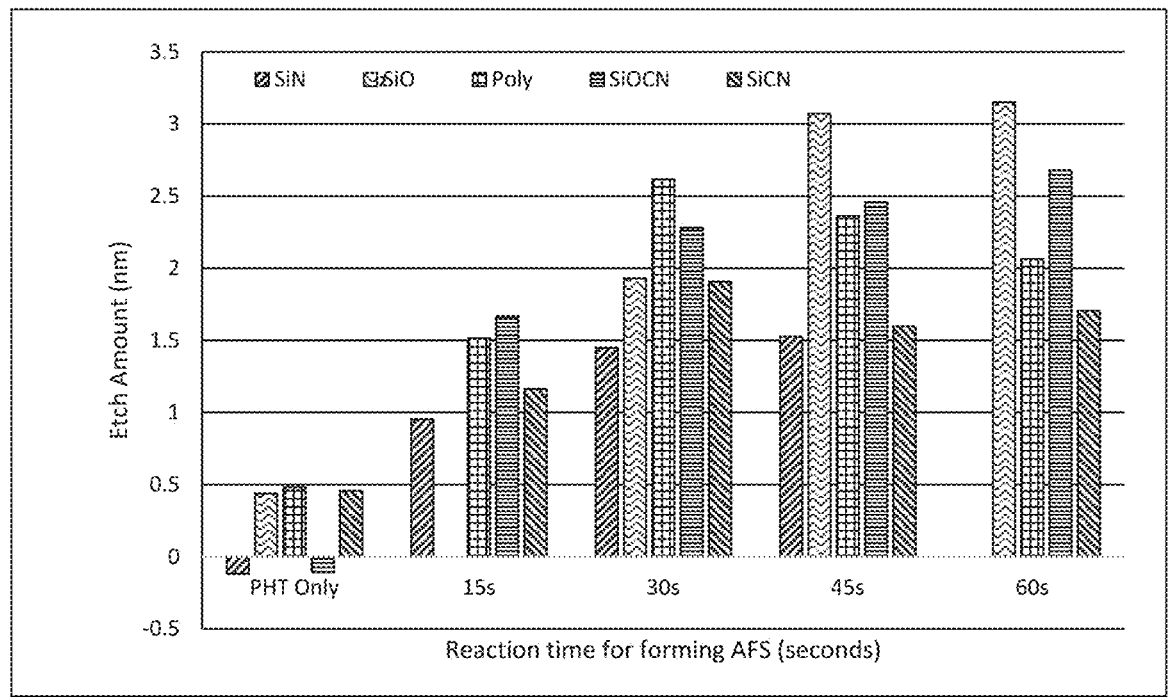
FIG. 7 is a chart showing experimental results for some example etch amounts for some example materials at varying reaction times for the formation of a reacted layer using some method embodiments of the present disclosure.

The chart in FIG. 7 shows experimental results for some example etch amounts (in nm) for some example materials (SiN, SiO2, polysilicon, SiOCN, and SiCN) at varying reaction times (in seconds) for the formation of a reacted layer of AFS, using some methods according to some embodiments of the present disclosure. The chart in FIG. 7 illustrates that the amount of material conformally etched per cycle can be adjusted and fine tuned for a wide variety of uses and applications.

In some embodiments, based on a selection of the plasma-excited second etch gas relative to the material(s) of the spacer layer, the underlying spacer layer can be not removed or only minimally removed by the ion bombardment from exposure to a plasma-excited second etch gas while the reacted layer is being removed and/or after the reacted layer is removed. This selective etching of the reacted layer relative to the unreacted/unmodified spacer layer combined with the self-limiting nature of the formation of the reacted layer (as described above) can provide an advantage of a precisely-controlled conformal etching process. For example, by controlling the reaction time for forming the reacted layer and/or by a selection of the gases, materials, and plasma processing parameters, a predictable and repeatable thickness of the reacted layer can be formed and then removed (e.g., 1 nm thickness per cycle can be possible) for a precisely-controlled and uniform conformal etching process.

Figure 1B:
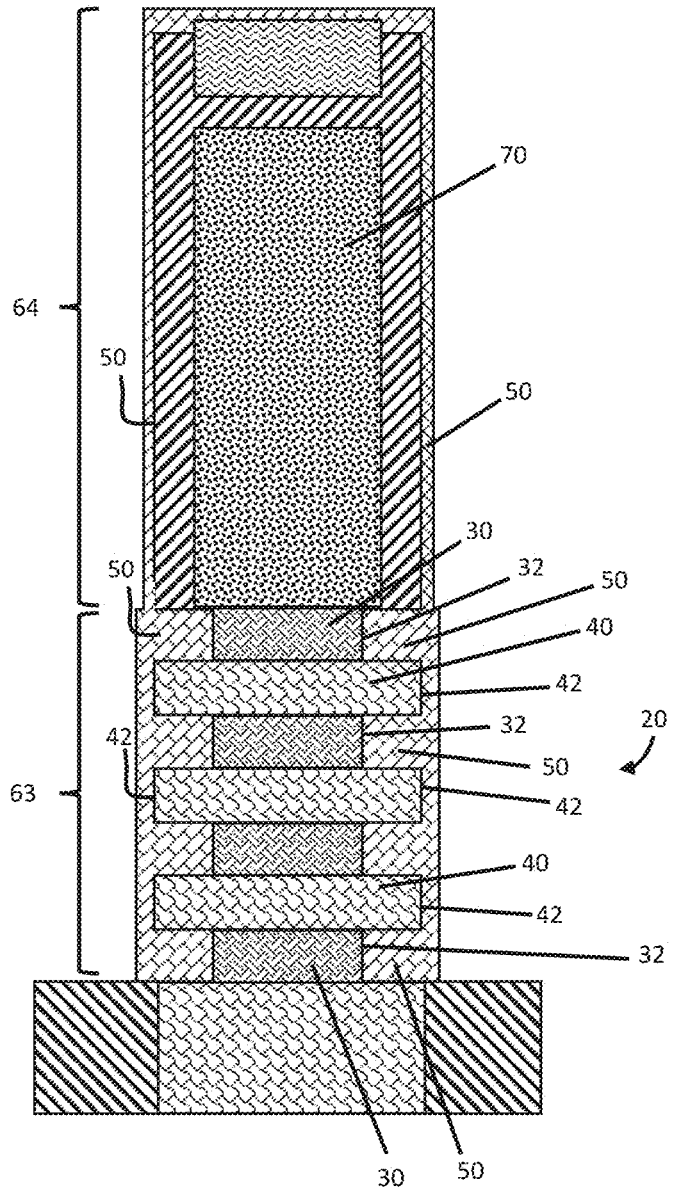
Figure 1C:
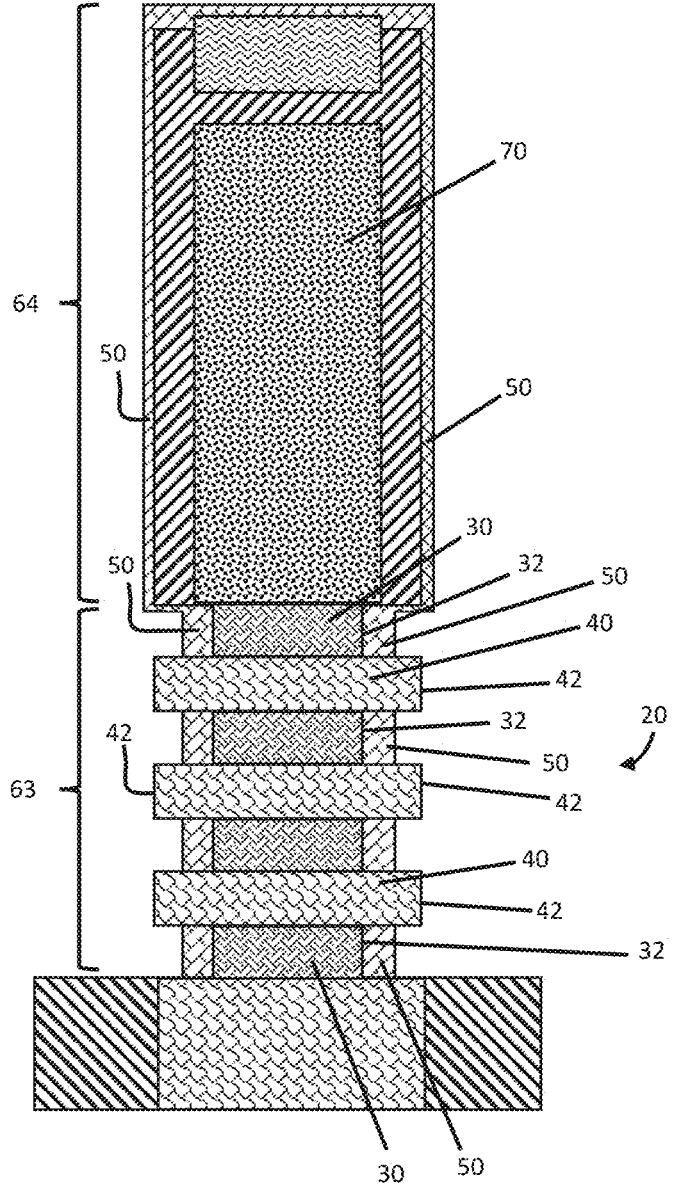

Next, some advantages that can be realized by implementing some embodiments of the present disclosure will be described. Some methods according to some embodiments can provide surface growth of AFS to enhance conformal removal of native oxide. An advantage of using some method embodiments can be self-limiting selective etching of oxide and low-k materials. An advantage of using some method embodiments can be controlled thickness removal per cycle. An advantage of using some method embodiments can be a potential for use in, as part of, or as an alternative to, an isotropic quasi-atomic-layer-etch (qALE) etch approach. An advantage of using some method embodiments can be conformal deposition and removal of AFS using unbiased plasma. An advantage of using some method embodiments can be uniform vertical and lateral etching with minimal or no excess top loss or isolated/nested delta, as compared to prior biased processes. An advantage of using some method embodiments can be top/bottom delta and isolated/nested delta issues being resolved to less than or equal to 1 nm. An advantage of using some method embodiments can be a capability of using a single existing plasma processing system or platform (e.g., model ACTIA platform by Tokyo Electron Ltd. (TEL)) for AFS-based selective etch and subsequent inner spacer etch steps, which can reduce tool transfers and increase throughput. An advantage of using some method embodiments can be providing a single temperature process for process stability, such as at room temperature (i.e., no extra heating or thermal budget required). Accordingly, some embodiments of the present disclosure can overcome the problems of prior processing methods described above with reference to FIGS. 1A to 1C.

FIG. 8 illustrates a flow chart implementing the ion-assisted self-limited conformal etch in accordance with an embodiment of the present disclosure.

In an embodiment, a method for forming a semiconductor device includes providing a substrate having a patterned structure comprising semiconductor materials, wherein the patterned structure has a side profile including indentations, and wherein a spacer layer is conformally deposited over the patterned structure and within the indentations (box 910). The method includes reacting a surface of the spacer layer with a plasma-excited first etch gas to form a reacted layer on the spacer layer, wherein the plasma-excited first etch gas includes fluorine, hydrogen, and nitrogen (box 920). The method includes removing at least part of the reacted layer by ion bombardment from exposure to a plasma-excited second etch gas (box 930).

FIG. 9 illustrates a flow chart implementing the ion-assisted self-limited conformal etch in accordance with an embodiment of the present disclosure.

In an embodiment, a method for forming a semiconductor device includes providing a substrate having a patterned film stack including alternating first and second films that are vertically stacked, wherein the first films have a first outer dimension, wherein the second films have a second outer dimension, wherein the second films have indentations so that the second outer dimension of the second films is smaller than the first outer dimension of the first films, wherein a spacer layer is conformally deposited over the patterned film stack and within the indentations in the second films, and wherein the spacer layer comprises a silicon-carbon-containing material, a silicon-oxygen-containing material, or a silicon-carbon-oxygen-containing material (box 940). The method includes reacting a surface of the spacer layer with a plasma-excited first etch gas to form a reacted layer on the spacer layer, wherein the plasma-excited first etch gas includes fluorine, hydrogen, and nitrogen, wherein the reacted layer comprises ammonium fluorosilicate (AFS) (box 950). The method includes removing at least part of the reacted layer by ion bombardment from exposure to a plasma-excited second etch gas (box 960). The method includes sequentially repeating the reacting of the surface of the spacer layer and the removing at least part of the reacted layer at least once to expose side surfaces of the first films while retaining at least part of the spacer layer in the indentations of the second films (box 970).

FIG. 10 illustrates a flow chart implementing the ion-assisted self-limited conformal etch in accordance with an embodiment of the present disclosure.

In an embodiment, a method for forming a semiconductor device includes providing a substrate having a patterned film stack including alternating first and second films that are vertically stacked, wherein the first films have a first outer dimension, wherein the second films have a second outer dimension, wherein the second films have indentations so that the second outer dimension of the second films is smaller than the first outer dimension of the first films, wherein a spacer layer is conformally deposited over the patterned film stack and within the indentations in the second films, and wherein the spacer layer comprising SiOCN (box 1010). The method includes reacting a surface of the spacer layer with a plasma-excited first etch gas to form a reacted layer on the spacer layer, wherein the plasma-excited first etch gas includes fluorine, hydrogen, and nitrogen, wherein the reacted layer comprises ammonium fluorosilicate (AFS) (box 1020). The method includes removing at least part of the reacted layer by ion bombardment from exposure to a plasma-excited second etch gas (box 1030). The method includes sequentially repeating the reacting of the surface of the spacer layer and the removing at least part of the reacted layer at least once to expose side surfaces of the first films while retaining at least part of the spacer layer in the indentations of the second films, wherein the reacting of the surface of the spacer layer and the removing at least part of the reacted layer are performed in a same chamber of a same plasma processing system using isotropic plasma exposures, wherein the reacting of the surface of the spacer layer and the removing at least part of the reacted layer are performed within a same substrate temperature range from 8 to 28 degrees Celsius (box 1040).

The embodiments described in FIGS. 8-10 may be implemented as further described using FIGS. 1-7.

More example embodiments of the present disclosure are summarized here. Other embodiments can also be understood from the entirety of the specification as well as the claims filed herein.

Example 1. A method for forming a semiconductor device, the method comprising: providing a substrate having a patterned structure comprising semiconductor materials, where the patterned structure has a side profile including indentations, and where a spacer layer is conformally deposited over the patterned structure and within the indentations; reacting a surface of the spacer layer with a plasma-excited first etch gas to form a reacted layer on the spacer layer, where the plasma-excited first etch gas includes fluorine, hydrogen, and nitrogen; and removing at least part of the reacted layer by ion bombardment from exposure to a plasma-excited second etch gas.

Example 2. The method of example 1, where the patterned structure comprises a patterned film stack including alternating first and second films that are vertically stacked, where the first films have a first outer dimension, where the second films have a second outer dimension, where the second films have the indentations so that the second outer dimension of the second films is smaller than the first outer dimension of the first films, where the spacer layer is conformally deposited over the patterned film stack and within the indentations in the second films; and where the removing at least part of the reacted layer exposes side surfaces of the first films while retaining at least part of the spacer layer in the indentations of the second films.

Example 3. The method of one of examples 1 to 2, further comprising sequentially repeating the reacting of the surface of the spacer layer and the removing at least part of the reacted layer at least once to expose the side surfaces of the first films while retaining at least part of the spacer layer in the indentations of the second films.

Example 4. The method of one of examples 1 to 3, where the reacting of the surface of the spacer layer and the removing at least part of the reacted layer are performed within a same substrate temperature range.

Example 5. The method of one of examples 1 to 4, where the same substrate temperature range is from 8 to 28 degrees Celsius.

Example 6. The method of one of examples 1 to 5, where the reacting of the surface of the spacer layer and the removing at least part of the reacted layer use isotropic plasma exposures.

Example 7. The method of one of examples 1 to 6, where the reacting of the surface of the spacer layer comprises generating the plasma-excited first etch gas in a first chamber of a plasma processing system using a capacitively coupled plasma (CCP) source, and where the removing at least part of the reacted layer comprise generating the plasma-excited second etch gas in the first chamber of the plasma processing system using the CCP source.

Example 8. The method of one of examples 1 to 7, further comprising supporting the substrate with a substrate holder that is not electrically biased.

Example 9. The method of one of examples 1 to 8, where the spacer layer comprises a silicon-carbon-containing material, a silicon-oxygen-containing material, a silicon-nitrogen-containing material, or a silicon-carbon-oxygen-containing material.

Example 10. The method of one of examples 1 to 9, where the spacer layer comprises SiO2, SiC, SiN, SiOC, or SiOCN.

Example 11. The method of one of examples 1 to 10, where the reacted layer comprises an ammonium fluorosilicate (AFS) layer.

Example 12. The method of one of examples 1 to 11, where the plasma-excited first etch gas comprises SF6, NF3, N2, H2, NH3, HF, CF4, CHF3, CH2F2, CH3F, or any combination thereof.

Example 13. The method of one of examples 1 to 12, where the plasma-excited first etch gas contains SF6, H2, and N2, or the plasma-excited first etch gas contains NF3, H2, and N2.

Example 14. The method of one of examples 1 to 13, where the plasma-excited second etch gas comprises N2, H2, O2, Ar, CO, He, Kr, Xe, or any combination thereof.

Example 15. A method for forming a semiconductor device, the method comprising: providing a substrate having a patterned film stack including alternating first and second films that are vertically stacked, where the first films have a first outer dimension, where the second films have a second outer dimension, where the second films have indentations so that the second outer dimension of the second films is smaller than the first outer dimension of the first films, where a spacer layer is conformally deposited over the patterned film stack and within the indentations in the second films, and where the spacer layer comprises a silicon-carbon-containing material, a silicon-oxygen-containing material, a silicon-nitrogen-containing material, or a silicon-carbon-oxygen-containing material; reacting a surface of the spacer layer with a plasma-excited first etch gas to form a reacted layer on the spacer layer, where the plasma-excited first etch gas includes fluorine, hydrogen, and nitrogen, where the reacted layer comprises ammonium fluorosilicate (AFS); removing at least part of the reacted layer by ion bombardment from exposure to a plasma-excited second etch gas; and sequentially repeating the reacting of the surface of the spacer layer and the removing at least part of the reacted layer at least once to expose side surfaces of the first films while retaining at least part of the spacer layer in the indentations of the second films.

Example 16. The method of example 15, where the reacting of the surface of the spacer layer and the removing at least part of the reacted layer are performed within a same substrate temperature range, where the same substrate temperature range is from 8 to 28 degrees Celsius.

Example 17. The method of one of examples 15 to 16, where the reacting of the surface of the spacer layer and the removing at least part of the reacted layer use isotropic plasma exposures; where the spacer layer comprises SiOCN; where the plasma-excited first etch gas contains SF6, H2, and N2, or the plasma-excited first etch gas contains NF3, H2, and N2; and where the plasma-excited second etch gas includes N2, H2, O2, Ar, CO, He, Kr, Xe, or any combination thereof.

Example 18. A method for forming a semiconductor device, the method comprising: providing a substrate having a patterned film stack including alternating first and second films that are vertically stacked, where the first films have a first outer dimension, where the second films have a second outer dimension, where the second films have indentations so that the second outer dimension of the second films is smaller than the first outer dimension of the first films, where a spacer layer is conformally deposited over the patterned film stack and within the indentations in the second films, and where the spacer layer comprising SiOCN; reacting a surface of the spacer layer with a plasma-excited first etch gas to form a reacted layer on the spacer layer, where the plasma-excited first etch gas includes fluorine, hydrogen, and nitrogen, where the reacted layer comprises ammonium fluorosilicate (AFS); removing at least part of the reacted layer by ion bombardment from exposure to a plasma-excited second etch gas; and sequentially repeating the reacting of the surface of the spacer layer and the removing at least part of the reacted layer at least once to expose side surfaces of the first films while retaining at least part of the spacer layer in the indentations of the second films, where the reacting of the surface of the spacer layer and the removing at least part of the reacted layer are performed in a same chamber of a same plasma processing system using isotropic plasma exposures, where the reacting of the surface of the spacer layer and the removing at least part of the reacted layer are performed within a same substrate temperature range from 8 to 28 degrees Celsius.

Example 19. The method of example 18, where the plasma-excited first etch gas contains SF6, H2, and N2, or the plasma-excited first etch gas contains NF3, H2, and N2.

Example 20. The method of one of examples 18 to 19, where the plasma-excited second etch gas comprises N2, H2, O2, Ar, CO, He, Kr, Xe, or any combination thereof.

While illustrative and example embodiments have been described with reference to illustrative drawings, this description is not intended to be construed in a limiting sense. Various modifications and combinations of the illustrative and example embodiments, as well as other embodiments, can be apparent to persons skilled in the pertinent art upon referencing the present disclosure. It is therefore intended that the appended claims encompass any and all of such modifications, equivalents, or embodiments.

What is claimed is:

1. A method for forming a semiconductor device, the method comprising:

providing a substrate having a patterned structure comprising semiconductor materials, wherein the patterned structure has a side profile including indentations, and wherein a spacer layer is conformally deposited over the patterned structure and within the indentations;

reacting a surface of the spacer layer with a plasma-excited first etch gas to form a reacted layer on the spacer layer, wherein the plasma-excited first etch gas includes fluorine, hydrogen, and nitrogen; and removing at least part of the reacted layer by ion bombardment from exposure to a plasma-excited second etch gas, wherein the patterned structure comprises a patterned film stack including alternating first and second films that are vertically stacked, wherein the first films have a first outer dimension, wherein the second films have a second outer dimension, wherein the second films have the indentations so that the second outer dimension of the second films is smaller than the first outer dimension of the first films, wherein the spacer layer is conformally deposited over the patterned film stack and within the indentations in the second films; and wherein the removing of at least part of the reacted layer exposes side surfaces of the first films while retaining at least part of the spacer layer in the indentations of the second films.

2. The method of claim 1, further comprising sequentially repeating the reacting of the surface of the spacer layer and the removing of at least part of the reacted layer at least once to expose the side surfaces of the first films while retaining at least part of the spacer layer in the indentations of the second films.

3. The method of claim 1, wherein the reacting of the surface of the spacer layer and the removing of at least part of the reacted layer are performed within a same substrate temperature range.

4. The method of claim 3, wherein the same substrate temperature range is from 8 to 28 degrees Celsius.

5. The method of claim 1, wherein the reacting of the surface of the spacer layer and the removing of at least part of the reacted layer use isotropic plasma exposures.

6. The method of claim 5, wherein the reacting of the surface of the spacer layer comprises generating the plasma-excited first etch gas in a first chamber of a plasma processing system using a capacitively coupled plasma (CCP) source, and wherein the removing of at least part of the reacted layer comprise generating the plasma-excited second etch gas in the first chamber of the plasma processing system using the CCP source.

7. The method of claim 6, further comprising supporting the substrate with a substrate holder that is not electrically biased.

8. The method of claim 1, wherein the spacer layer comprises a silicon-carbon-containing material, a silicon-nitrogen-containing material, a silicon-oxygen-containing material, or a silicon-carbon-oxygen-containing material.

9. The method of claim 8, wherein the spacer layer comprises SiO2, SiC, SiN, SiOC, or SiOCN.

10. The method of claim 9, wherein the reacted layer comprises an ammonium fluorosilicate (AFS) layer.

11. The method of claim 1, wherein the plasma-excited first etch gas comprises $SF_6$, $NF_3$, $N_2$, $H_2$, $NH_3$, $HF$, $CF_4$, $CHF_3$, $CH_2F_2$, $CH_3F$, or any combination thereof.

12. The method of claim 1, wherein the plasma-excited first etch gas contains $SF_6$, $H_2$, and $N_2$, or the plasma-excited first etch gas contains $NF_3$, $H_2$, and $N_2$.

13. The method of claim 1, wherein the plasma-excited second etch gas comprises $N_2$, $H_2$, $O_2$, Ar, CO, He, Kr, Xe, or any combination thereof.

14. A method for forming a semiconductor device, the method comprising:

providing a substrate having a patterned film stack including alternating first and second films that are vertically stacked, wherein the first films have a first outer dimension, wherein the second films have a second outer dimension, wherein the second films have indentations so that the second outer dimension of the second films is smaller than the first outer dimension of the first films, wherein a spacer layer is conformally deposited over the patterned film stack and within the indentations in the second films, and wherein the spacer layer comprises a silicon-carbon-containing material, a silicon-nitrogen-containing material, a silicon-oxygen-containing material, or a silicon-carbon-oxygen-containing material;

reacting a surface of the spacer layer with a plasma-excited first etch gas to form a reacted layer on the spacer layer, wherein the plasma-excited first etch gas includes fluorine, hydrogen, and nitrogen, wherein the reacted layer comprises ammonium fluorosilicate (AFS);

removing at least part of the reacted layer by ion bombardment from exposure to a plasma-excited second etch gas; and sequentially repeating the reacting of the surface of the spacer layer and the removing of at least part of the reacted layer at least once to expose side surfaces of the first films while retaining at least part of the spacer layer in the indentations of the second films.

15. The method of claim 14, wherein the reacting of the surface of the spacer layer and the removing of at least part of the reacted layer are performed within a same substrate temperature range, wherein the same substrate temperature range is from 8 to 28 degrees Celsius.

16. The method of claim 14, wherein the reacting of the surface of the spacer layer and the removing of at least part of the reacted layer use isotropic plasma exposures;

wherein the spacer layer comprises SiOCN;

wherein the plasma-excited first etch gas contains $SF_6$, $H_2$, and $N_2$, or the plasma-excited first etch gas contains $NF_3$, $H_2$, and $N_2$; and wherein the plasma-excited second etch gas includes $N_2$, $H_2$, $O_2$, Ar, CO, He, Kr, Xe, or any combination thereof.

17. A method for forming a semiconductor device, the method comprising:

providing a substrate having a patterned film stack including alternating first and second films that are vertically stacked, wherein the first films have a first outer dimension, wherein the second films have a second outer dimension, wherein the second films have indentations so that the second outer dimension of the second films is smaller than the first outer dimension of the first films, wherein a spacer layer is conformally deposited over the patterned film stack and within the indentations in the second films, and wherein the spacer layer comprising SiOCN;

reacting a surface of the spacer layer with a plasma-excited first etch gas to form a reacted layer on the spacer layer, wherein the plasma-excited first etch gas includes fluorine, hydrogen, and nitrogen, wherein the reacted layer comprises ammonium fluorosilicate (AFS);

removing at least part of the reacted layer by ion bombardment from exposure to a plasma-excited second etch gas; and sequentially repeating the reacting of the surface of the spacer layer and the removing of at least part of the reacted layer at least once to expose side surfaces of the first films while retaining at least part of the spacer layer in the indentations of the second films, wherein the reacting of the surface of the spacer layer and the removing at least part of the reacted layer are performed in a same chamber of a same plasma processing system using isotropic plasma exposures, wherein the reacting of the surface of the spacer layer and the removing at least part of the reacted layer are performed within a same substrate temperature range from 8 to 28 degrees Celsius.

18. The method of claim 17, wherein the plasma-excited first etch gas contains $SF_6$, $H_2$, and $N_2$, or the plasma-excited first etch gas contains $NF_3$, $H_2$, and $N_2$.

19. The method of claim 17, wherein the plasma-excited second etch gas comprises $N_2$, $H_2$, $O_2$, Ar, CO, He, Kr, Xe, or any combination thereof.

* * * * *